United States Patent [19]

Freyman et al.

[11] Patent Number: 5,077,633
[45] Date of Patent: Dec. 31, 1991

[54] GROUNDING AN ULTRA HIGH DENSITY PAD ARRAY CHIP CARRIER

[75] Inventors: Bruce J. Freyman, Sunrise; Barry M. Miles, Plantation; Frank J. Juskey, Coral Springs, all of Fla.

[73] Assignee: Motorola Inc., Schaumburg, Ill.

[21] Appl. No.: 345,280

[22] Filed: May 1, 1989

[51] Int. Cl.⁵ .............................. H05K 7/10
[52] U.S. Cl. ....................... 361/403; 174/255; 174/260; 361/417; 361/420
[58] Field of Search ............. 361/397, 400, 402, 403, 361/405, 406, 410, 414, 417, 419, 420; 357/80; 174/255, 260, 138 G

[56] References Cited

U.S. PATENT DOCUMENTS

| | | |
|---|---|---|
| 4,574,879 | 3/1986 | DeGree et al. ................... 361/403 |
| 4,626,309 | 12/1986 | Mullen, III et al. . |
| 4,631,639 | 12/1986 | Biraud ............................... 361/403 |
| 4,700,276 | 10/1987 | Freyman et al. .. |
| 4,700,473 | 10/1987 | Freyman et al. . |
| 4,787,853 | 11/1988 | Igarashi ............................ 361/405 |

OTHER PUBLICATIONS

I.E.E.E. Spectrum, Reed Bowlby, Jun. 1985, pp. 37–42.

Primary Examiner—Gregory D. Thompson
Attorney, Agent, or Firm—Pablo Meles

[57] ABSTRACT

A die pad (108) with a punched hole providing a throughway (110) is affixed upon the chip carrier base 100. Such throughway permits the electronic interconnection of the die backside (112) to a conductive runner (104) by electrically conductive material (110) set between the die backside (112) and the conductive runner (104).

11 Claims, 3 Drawing Sheets

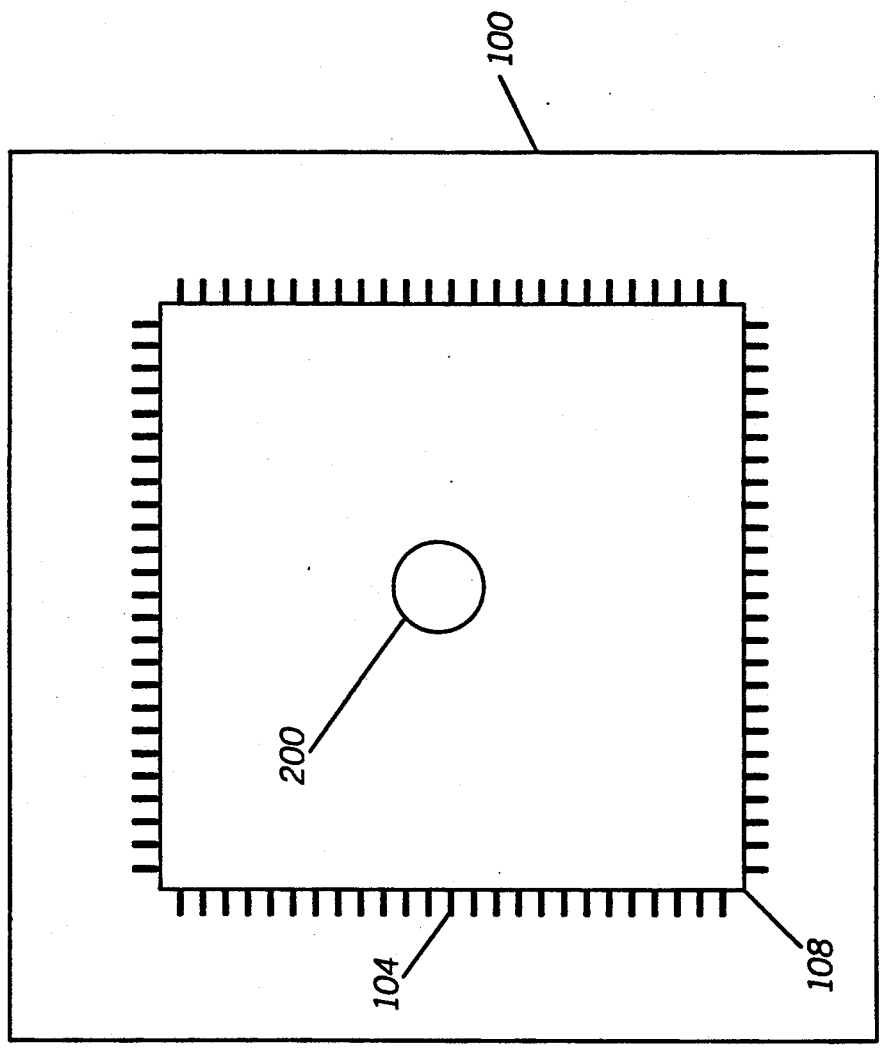

GROUNDING AN ULTRA HIGH DENSITY PAD ARRAY CHIP CARRIER

TECHNICAL FIELD

This invention relates generally to a method of making an ultra high density pad array chip carrier, more particularly a method for grounding of an integrated circuit (I.C.) device in ultra high density pad array chip carriers.

BACKGROUND ART

Grounding ultra high density chip carrier assemblies typically requires a wire bond from a conductive runner active as ground on a substrate to a metallized polyimide film die pad. Wire bonding in chip carrier assemblies is disadvantageous due to the larger die pad size required to bond the wire, larger production and material costs, and lower current carrying capacities of typical bond wires such as a gold bond wire.

Eliminating wire bonding to metallized polyimide film die pads reduces several undesirable effects. First, wire bonding requires a larger die pad to allow a wire bonder to place a wire next to the die on the metallized polyimide film die pad. Further, polyimide film (as opposed to metallized alumina) produces poor wire bonds due to its compliant nature. Additionally, eliminating wire bonds permits the elimination of the metal layer on the polyimide die pad, since no wire bonding to the die pad is necessary. Wire bonding requires the operator to change the wire bonder parameters, such as, from a ceramic chip carrier profile to a polyimide film profile in order to make a reliable bond. Grounding a high power integrated circuit device with a wire bond from a polyimide film die pad to a conductive runner is an ineffective method of semiconductor grounding due to the insufficient current carrying capacity of typical bond wires. Disposing of the grounded wire bond by means of the present invention reduces production costs and production time, while increasing the efficiency and effectiveness of the chip carrier assembly.

SUMMARY OF THE INVENTION

Accordingly, it is an object of the present invention to provide a method for grounding the backside or bottom of a semiconductor die to a chip carrier base overcoming the detriments discussed above.

Briefly, according to the invention, a die pad constructed of a suitable dielectric material has a hole formed therein, so as to provide a throughway between its top and bottom surfaces. This die pad is affixed to the chip carrier base. The throughway permits the interconnection of the bottom surface of the die to a conductive runner by means of an electrically conductive material.

BRIEF DESCRIPTION OF THE DRAWINGS

FIG. 3 illustrates a top plan view of the chip carrier base with the die pad placed on top of the chip carrier base in accordance with the present invention.

DETAILED DESCRIPTION OF THE PREFERRED EMBODIMENT

Figure 1:
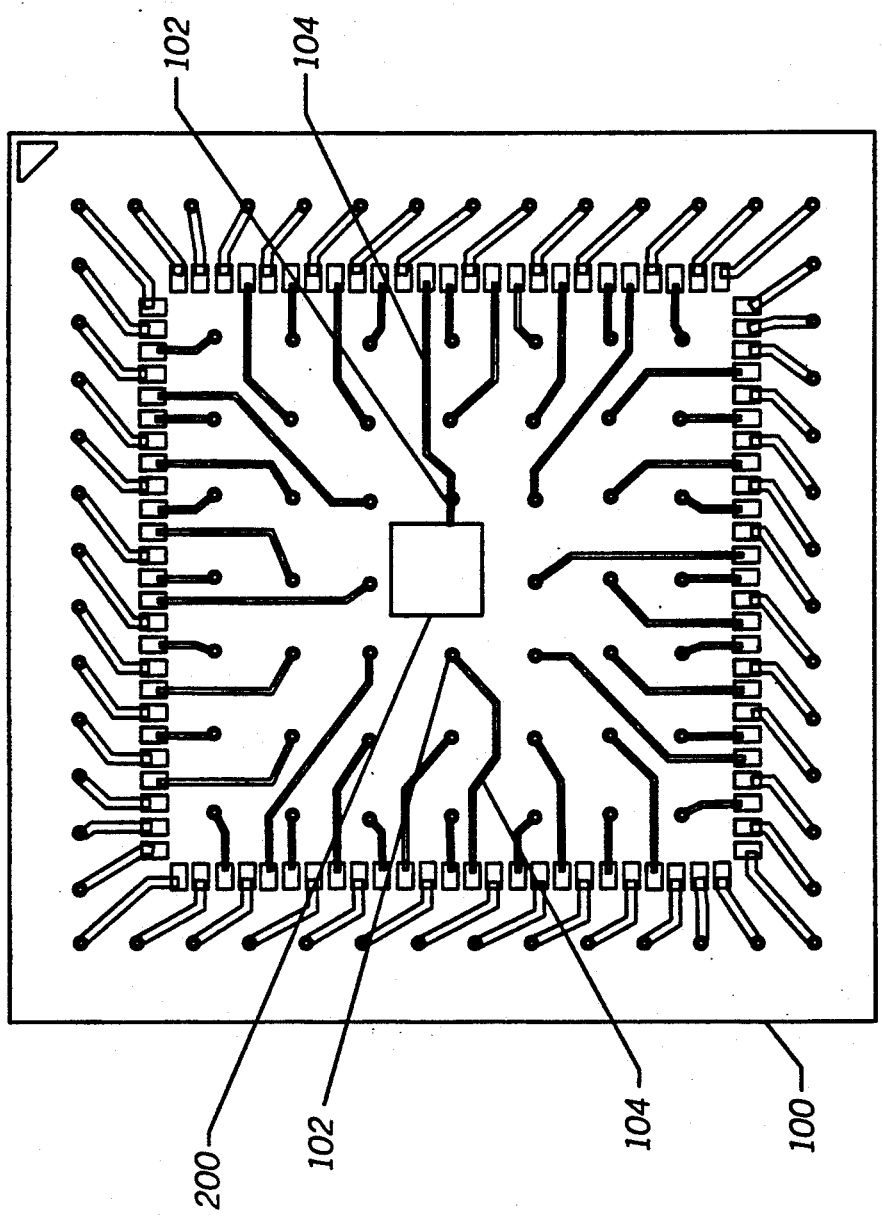
FIG. 1 illustrates a top plan view of the chip carrier with a typical pattern of conductive areas.

Referring to FIG. 1, there is shown an alumina ceramic substrate (100) having conductive areas (or metal runners) (104) deposited thereon. Some of these conductive areas terminates at a metal land (200) that serves as a common grounding point. Preferably, the metal land comprises a square having a size dependent on the design of the substrate, although other shapes may be used. According to the invention, a convenient size of 0.020 inches × 0.020 inches (0.051 cm × 0.051 cm) facilitates assembly. The metal land 200 is positioned directly below the through-hole in the die pad (108) shown in FIG. 2.

Figure 2:
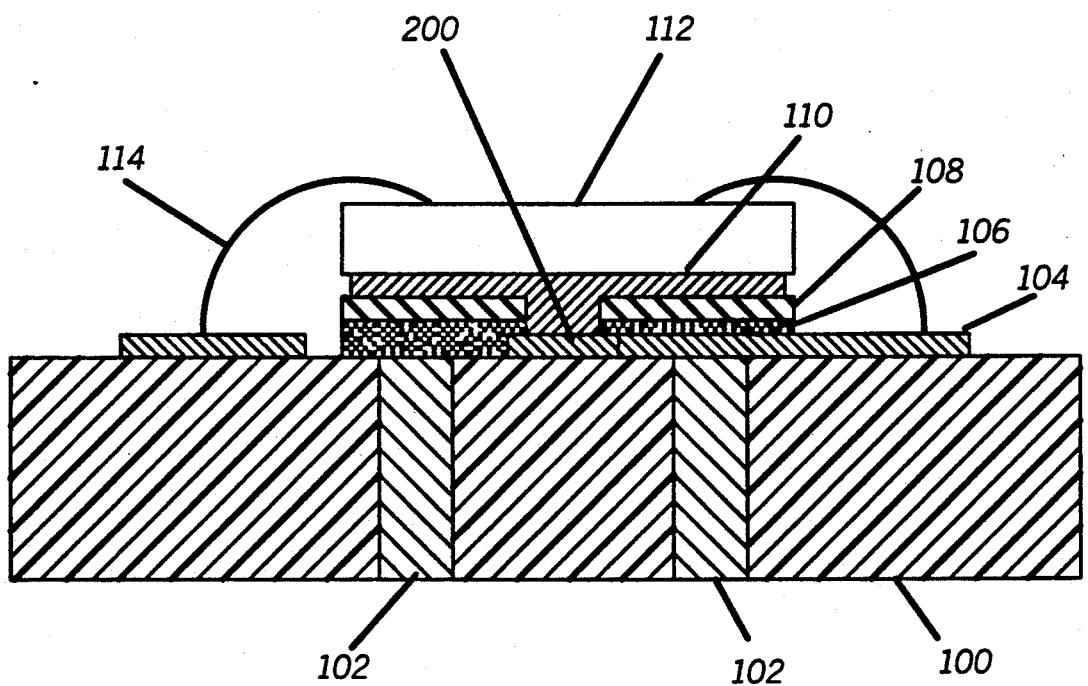
FIG. 2 illustrates a cross section of the chip carrier, die pad, and semiconductor die in accordance with the present invention.

Referring to FIG. 2, the die pad (108) is affixed to at least a portion of the conductive areas (104) by means of an effective amount of adhesive, preferably Pyralux acrylic adhesive (106) made by Dupont. The die pad (108) comprises of a polyimide film 0.002 inches (0.005 cm) thick, and laminated with 0.001 inch (0.003 cm) Dupont Pyralux modified acrylic adhesive (106). Before the die pad is tacked onto the substrate, a hole, (preferably 0.020 inches (0.051 cm) to 0.100 inches (0.255 cm) in diameter) is formed in the polyimide film die pad and the attached Pyralux acrylic adhesive. This hole is positioned in the die pad (108) so as to mount over the grounded metal land (200) on the ceramic substrate (100). Optimally, the solder filled through-holes (102) may be electronically connected to the conductive areas of the substrate (104) as is known in the art.

Referring to FIGS. 2 and 3, the die pad and acrylic adhesive is then positioned on the substrate, which is then laminated. The lamination process causes an intimate bond between the die pad (108), the acrylic adhesive (106) and the conductive areas (104).

Preferably, a conductive material (110) comprising silver filled epoxy flows through the through-hole formed in the die pad (108) and acrylic adhesive (106) to make contact with the grounded metal land (200) on the substrate (100). The silver filled epoxy is also dispensed onto the top surface of the die pad, creating an electronic connection between the bottom surface of the die (112) and the grounded metal land (200) when the die (112) is placed into the epoxy in an assembly process.

Finally, wire bonds (114) may be connected from various conductive areas (104) on the substrate to the semiconductor die (112).

What is claimed is:

1. A chip carrier assembly comprising:
   a semiconductor chip, having a bottom surface;
   a substrate including at least one conductive area;
   a nonconductive die pad intimately bonded to at least one of the conductive areas of the substrate having at least one passage therethrough, and being positioned between the semiconductor chip and the substrate; and
   an electrically conductive material, located in said passage and between the substrate and the semiconductor chip, for providing electrical interconnection between the semiconductor chip bottom surface and said one conductive area of the substrate.

2. A chip carrier assembly as defined in claim 1, wherein said substrate comprises an ceramic chip carrier base.

3. The chip carrier assembly as defined in claim 1, wherein said electrically conductive material comprises conductive metal filled epoxy.

4. The chip carrier assembly of claim 3, wherein said conductive metal filled epoxy comprises silver.

5. A chip carrier assembly comprises:
a semiconductor chip, having a bottom surface;
a substrate including at least one conductive area;
a polyimide film die pad intimately bonded to at least one of the conductive areas of the substrate having at least one passage therethrough, and being positioned between the semiconductor chip and the substrate; and
an electrically conductive material, located in said passage and between the substrate and the semiconductor chip, for providing electrical interconnection between the semiconductor chip bottom surface and said one conductive area of the substrate.

6. A chip carrier assembly comprising:
a semiconductor chip;
an alumina ceramic substrate including conductive areas;
a polyimide film die pad carried by the substrate having at least one passage therethrough, and being positioned between the semiconductor and the substrate, and
an electrically conductive silver filled epoxy, located in said passage and between the substrate and the semiconductor chip, for providing electrical inerconnection between the semiconductor chip and said one conductive area of the substrate.

7. A chip carrier assembly for mounting a semiconductor chip comprising:
a semiconductor die, having a bottom surface;
a chip carrier base including metallic runners;
a nonconductive die pad with at least one pathway intimately bonded to at least one of the metallic runners on the chip carrier base and positioned between the semiconductor die and said carrier base;
electrically conductive material interconnecting said semiconductor die bottom surface and said said metallic runner through said pathway in said die pad.

8. The chip carrier assembly of claim 7, wherein said chip carrier base comprises ceramic alumina.

9. The chip carrier assembly of claim 7, wherein said electrically conductive material comprises silver filled epoxy.

10. The chip carrier assembly of claim 7, wherein said pathway comprises a punched hole therethrough said die pad positioned directly above said one metallic runner.

11. A chip carrier assembly for mounting a semiconductor chip comprising:
a semiconductor die, having a bottom surface;
a chip carrier base including metallic runners;
a polyimide film die pad with at least one pathway intimately bonded to at least one of the metallic runners on the chip carrier base and positioned between the semiconductor die and said carrier base;
electrically conductive material interconnecting said semiconductor die bottom surface and said at least one said metallic runner through said pathway in said die pad.

* * * * *